(12) United States Patent
Naya

(10) Patent No.: US 7,714,437 B2
(45) Date of Patent: May 11, 2010

(54) SEMICONDUCTOR DEVICE AND METHOD FOR MOUNTING SEMICONDUCTOR CHIP

(75) Inventor: Akihiko Naya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/187,878

(22) Filed: Aug. 7, 2008

(65) Prior Publication Data

US 2009/0045510 A1 Feb. 19, 2009

(30) Foreign Application Priority Data

Aug. 14, 2007 (JP) .............................. 2007-211327

(51) Int. Cl.
*H01L 23/13* (2006.01)

(52) U.S. Cl. ................ 257/737; 257/778; 257/E23.004

(58) Field of Classification Search ................ 257/737, 257/738, 778, E23.004, E21.499
See application file for complete search history.

(56) References Cited

U.S. PATENT DOCUMENTS

| 5,569,960 | A | * | 10/1996 | Kumazawa et al. | ......... 257/738 |
| 6,011,694 | A | * | 1/2000 | Hirakawa | .................... 361/774 |
| 6,107,685 | A | * | 8/2000 | Nishiyama | .................. 257/737 |
| 6,288,445 | B1 | * | 9/2001 | Kimura | ...................... 257/737 |
| 6,534,875 | B1 | * | 3/2003 | Nishiyama | .................. 257/778 |
| 6,940,176 | B2 | * | 9/2005 | Chen | ........................... 257/778 |

FOREIGN PATENT DOCUMENTS

JP 2003-188366 A 7/2003

* cited by examiner

*Primary Examiner*—Roy K Potter
(74) *Attorney, Agent, or Firm*—Birch, Stewart, Kolasch & Birch, LLP

(57) ABSTRACT

A semiconductor device includes a rigid substrate, a flexible solid-state image sensor and bumps. The bumps are aligned along a pair of opposing edges of the rigid substrate, and the diameter of the bumps gradually increases from the center to the ends of the edges. Owing to the difference in diameter of the bumps, the solid-state image sensor is curved convexly to the rigid substrate.

5 Claims, 9 Drawing Sheets

SEMICONDUCTOR DEVICE AND METHOD FOR MOUNTING SEMICONDUCTOR CHIP

FIELD OF THE INVENTION

The present invention relates to a semiconductor device and a method for mounting a semiconductor chip. More particularly, the present invention relates to a method for directly mounting a semiconductor chip to a substrate without using a chip package, and a semiconductor device using this mounting method.

BACKGROUND OF THE INVENTION

Recent miniaturization and sophistication of electronic apparatus serve to encourage a chip mounting method to connect a semiconductor chip directly to a substrate without using a package. There is also known a solid state imaging device whose semiconductor chip (solid-state image sensor) is mounted, by this chip mounting method, to curve on a substrate so as to correct the aberration of a taking lens (see, Japanese Patent Laid-open Publication No. 2003-188366).

The substrate of this solid state imaging device has an upper surface that is spherically-curved to correspond to the curvature of field of the taking lens. Additionally, the solid-state imaging device is made thin, and follows the curved upper surface of the substrate when bonded thereto. This curved solid-state image sensor can achieve a good focusing state throughout the image plane even when combined with a simple taking lens.

Meanwhile, in order to improve an aperture ratio (light receiving efficiency), there is known a solid-state image sensor of back illuminated type which has a light receiving surface on a back side opposite to a front side provided with electrode pads. Because of the structure to receive light on the back side, the back illuminated type image sensors are made thinner than the general front illuminated type image sensors, so that the incident light on the back side can easily reach photodiodes contained in the image sensor. This means that the back illuminated type image sensors are flexible and easily curved.

However, even if the easily-curved back illuminated type image sensor is used, the solid state imaging device of the Publication No. 2003-188366 still has the problem that the curved upper surface is hard to shape on the substrate. If the substrate is a functional device to process the signals from the image sensor, the curved upper surface is especially difficult to shape.

SUMMARY OF THE INVENTION

In view of the foregoing, an object of the present invention is to provide a method for mounting a semiconductor chip to a substrate to curve the semiconductor chip, and provide a semiconductor device using this mounting method.

In order to achieve the above and other objects, a semiconductor device according to the present invention includes a rigid substrate, a plurality of bumps of different thickness, and a plate-like flexible semiconductor chip. The bumps are aligned and bonded along at least a pair of opposing edges of the rigid substrate. The bumps at both ends of the edges are thicker than the bumps in the center of the edges. The semiconductor chip is bonded to the bumps, and curved convexly to the rigid substrate.

The bumps may be aligned along all four edges of the rigid substrate. Further, additional bumps may be disposed in the center of the rigid substrate. It is preferred, in this case, that the bumps in the center are thinner than the bumps along the edges.

Preferably, the semiconductor chip is a back illuminated type solid-state image sensor which has an imaging surface on an opposite side to the rigid substrate. It is also preferred to provide the rigid substrate with one or both of a drive circuit for driving the solid-state image sensor and a signal processing circuit for processing an image signal from the solid-state image sensor.

A method for mounting a semiconductor chip according to the present invention includes a step of aligning and bonding bumps to a rigid substrate, and a step of bonding the semiconductor chip to the bumps. In the aligning and bonding step, a plurality of bumps of different thickness are aligned and bonded along at least a pair of opposing edges of the rigid substrate. The bumps at both ends of the edges are thicker than the bumps in the center of the edges. In the chip bonding step, the plate-like flexible semiconductor chip is bonded to the bumps such that the semiconductor chip is curved convexly to the rigid substrate.

Preferably, the aligning and joining step includes a mask placing step and a bump inserting step. In the mask placing step, the mask is placed over the rigid substrate. This mask has openings that align along the edges of the rigid substrate. In the bump inserting step, the bumps are inserted into the openings of the mask to bond the bumps to the rigid substrate.

According to the present invention, the semiconductor chip and the rigid substrate are joined through the bumps of different thickness. This simple configuration enables curving the semiconductor chip convexly to the rigid substrate. The curved semiconductor chip corrects the curvature of field of the taking lens. Therefore, a good focusing state is achieved throughout the light receiving surface, and image quality is improved.

When the bumps are aligned along all four edges of the rigid substrate, the curved shape of the semiconductor chip is firmly maintained. When additional bumps are disposed in the center of the rigid substrate, the curved shape of the semiconductor chip is more firmly maintained.

Since the semiconductor ship is the back illuminated type solid-state image sensor which is thinner than the general front illuminated type image sensors, the semiconductor chip is easily curved. Additionally, the semiconductor chip can be mounted in a predetermined curved state to the rigid substrate by flip-chip technology. When the rigid substrate is provided with a drive circuit to drive the solid-state image sensor and/or a signal processor circuit to process the signals from the solid-state image sensor, the semiconductor device becomes compact and slim.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
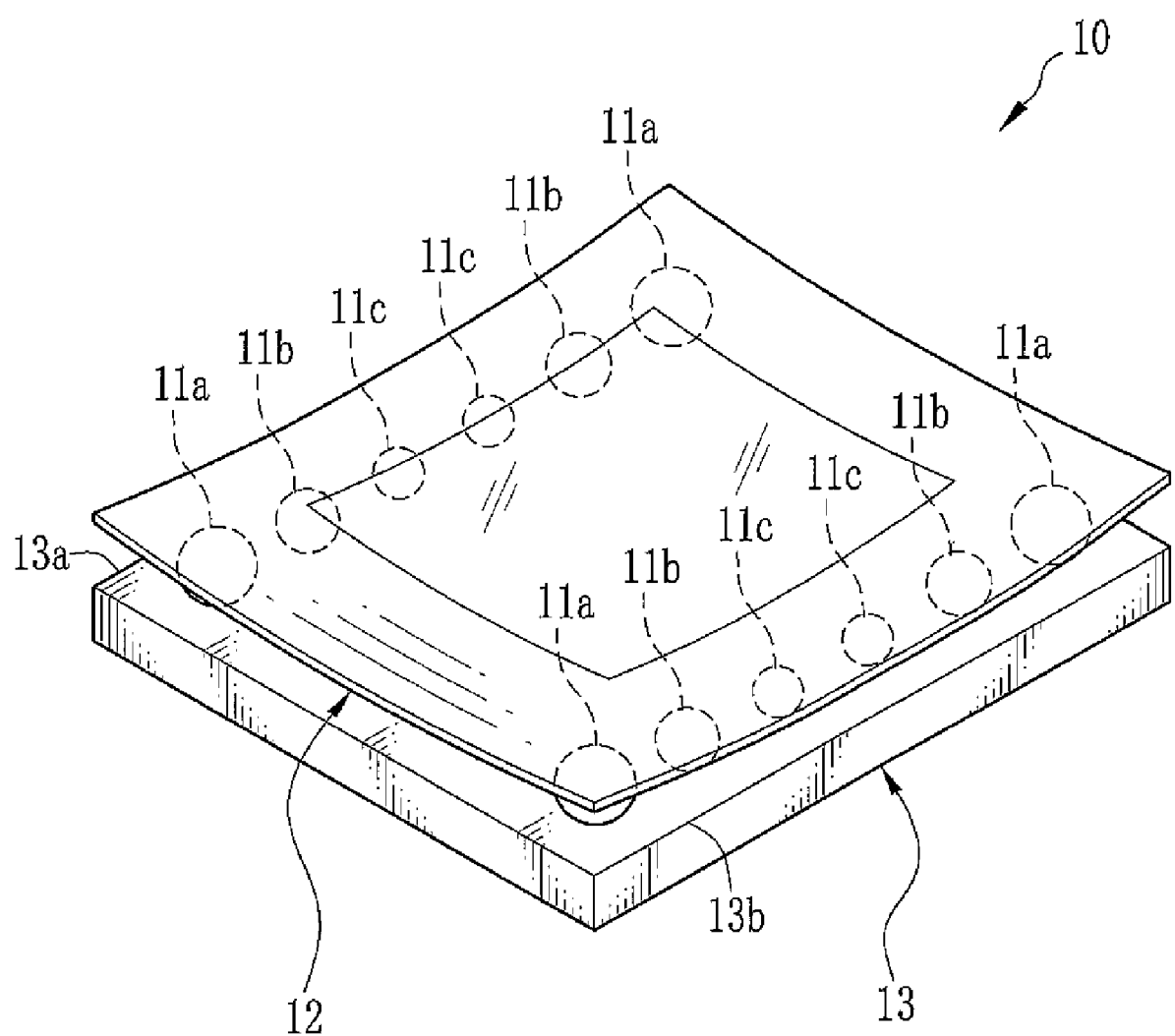
FIG. 1 is a perspective view of a semiconductor device according to a first embodiment of the present invention.

Referring to FIG. 1, a semiconductor device 10 is composed of bumps 11a-11c, a flexible solid-state image sensor (hereinafter, image sensor) 12 of a rectangular plate-like shape, and a rigid substrate 13. Bonded by solder to the rigid substrate 13 through the bumps 11a-11c, the solid-state image sensor 12 curves convexly to the rigid substrate 13.

The bumps 11a-11c are made of copper, for example, and different from each other in diameter. The bumps 11a have the largest diameter, and the bumps 11b have the second largest, and the bumps 11c have the smallest diameter. Since the bumps 11a-11c are made of copper, their diameter is not changed by the heat of soldering. The bumps 11a-11c are aligned along a pair of opposing edges 13a, 13b of the rigid substrate 13.

Disposed in the center of the edge 13a are two of the smallest diameter bumps 11c. The second largest bumps 11b are placed immediately outside the bumps 11c, and the largest diameter bumps 11a are placed outside the bumps 11b. Accordingly, a total of six bumps 11a-11c are aligned along the edge 13a. In the same manner, the bumps 11a-11c are aligned along the opposing edge 13b.

Figure 2:
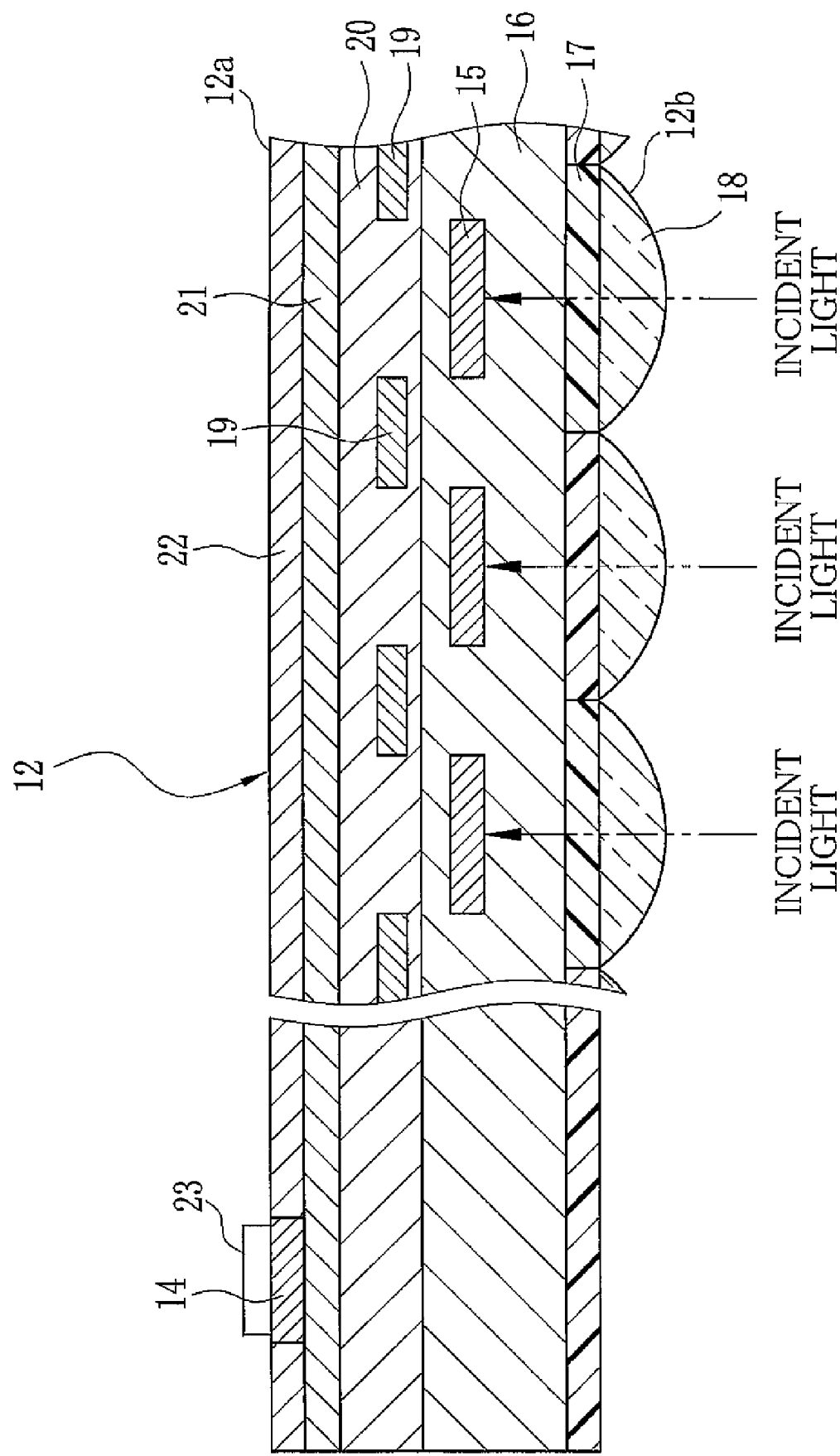
FIG. 2 is a cross sectional view schematically illustrating a structure of a solid-state image sensor.

As shown FIG. 2, the solid-state image sensor 12 as semiconductor die is a back illuminated type image sensor, to which the light enters from a back side 12b opposite to a front side 12a having electrode pads 14.

Each light receiving element 15 includes an embedded photodiode, and receives the incident light on the back side 12b. The light receiving elements 15 are arranged in a two-dimensional array, and spaced a few micro-meters apart within a semiconductor substrate 16. To allow light entering from the back side 12b, the semiconductor substrate 16 is made to 50 micro-meters thick or below (preferably about 10 micro-meters thick). Such thin thickness makes the semiconductor substrate 16 flexible. On the back side 12b, there are provided a color filter 17 to divide the incident light into a spectrum, and micro-lenses 18 to concentrate the incident light on the light receiving elements 15.

The light receiving element 15 receives the incident light, and generates a signal charge proportional to the amount of light. Above each light receiving element 15 (to the front side 12a) is provided a transfer electrode (gate electrode) 19 that transfers the signal charge, accumulated in the light receiving element 15, to a not-shown charge transfer channel (if the solid-state image sensor 12 is CCD) or amplifier (if the solid-state image sensor 12 is CMOS).

The transfer electrodes 19 are made of polysilicon or the like, and surrounded by an interlayer insulating layer 20 made of silicon dioxide or the like. The interlayer insulating layer 20 has a flat top surface, which supports a wiring layer 21 that is made of aluminum or the like and connected to the transfer electrodes 19 through contacts (not shown). Formed on the wiring layer 21 is an insulating protection layer 22 made of silicon dioxide or the like. The wiring layer 21 is connected to electrode pads 14 provided on the front side 12a. On each electrode pad 14, solder paste 23 is applied.

Figure 3:
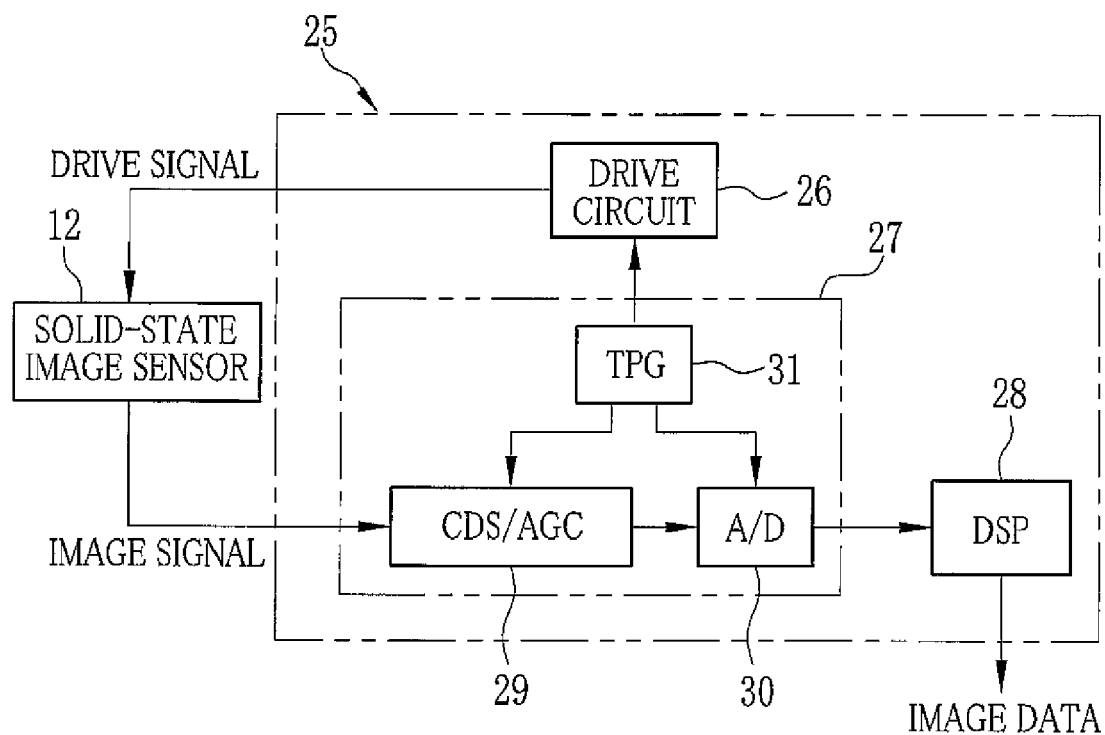
FIG. 3 is a block diagram of a peripheral circuit provided within a rigid substrate.

The rigid substrate 13 is a circuit board in a rectangular plate-like shape which is substantially the same shape and size as the solid-state image sensor 12. The rigid substrate 13 contains a peripheral circuit 25 which includes, as shown in FIG. 3, a drive circuit 26, an analog front-end circuit (AFE) 27 and a digital signal processor (DSP) 28.

Responding to a timing pulse input from the AFE 27, the drive circuit 26 enters an input signal to the solid-state image sensor 12 so as to initiate an image capturing operation of the solid-state image sensor 12. The AFE 27 includes a correlated double sampling/auto-gain controlling (CDS/AGC) circuit 29, an A/D converter 30 and a timing pulse generator (TPG) 31.

The CDS/AGC circuit 29 performs correlated double sampling to reduce noises from an image signal input from the solid-state image sensor 12, and adjusts the gain of the image signal. The A/D converter 30 digitizes the image signal processed in the CDS/AGC circuit 29.

The TPG 31 enters a timing pulse to the CDS/AGC circuit 29, the A/D converter 30 and the drive circuit 26 so as to synchronize these components. The DSP 28 applies predetermined signal processing, such as a color interpolation process, a luminance and chrominance (Y/C) conversion process, a gamma correction process and a white balance correction process to the digital image signal from the AFE 27, and generates digital image data.

Figure 4:
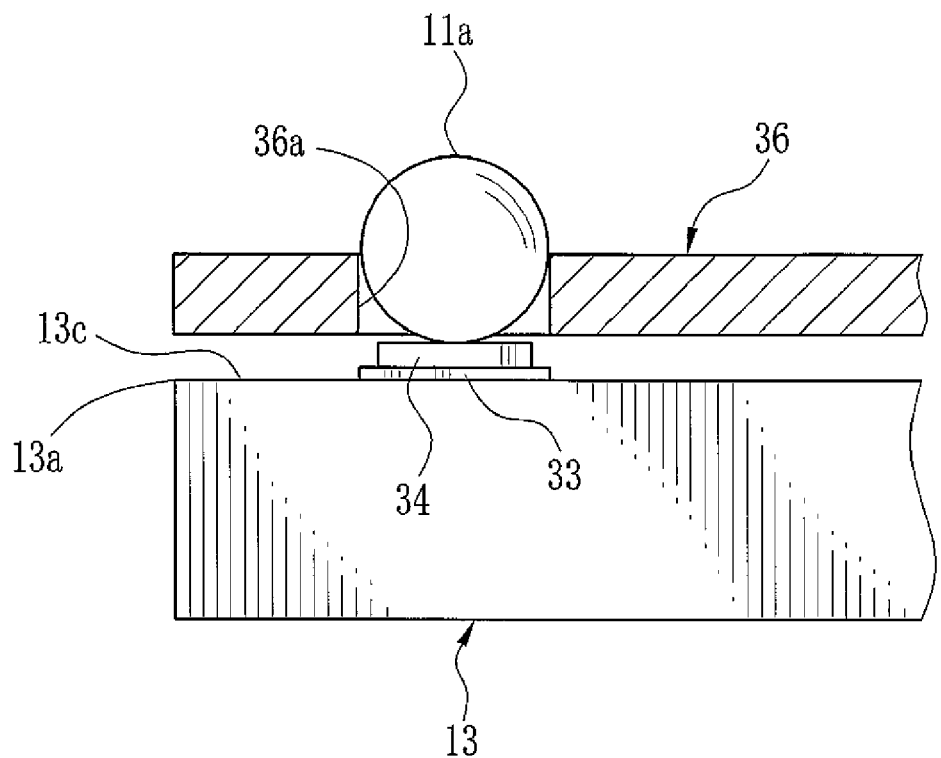
FIG. 4 is an explanatory side view of the rigid substrate, a mask cut in cross section and bumps.

As shown in FIG. 1 and FIG. 4, a plurality of electrodes 33 are provided along the edges 13a, 13b on an upper surface 13c of the rigid substrate 13. The electrodes 33 transmit drive signals from the peripheral circuit 25 to the solid-state image sensor 12, and also transmit the image signals from the solid-state image sensor 12 to the peripheral circuit 25. On each electrode 33, solder paste 34 is applied. The bumps 11a-11c are positioned on these solder paste 34.

Figure 5:
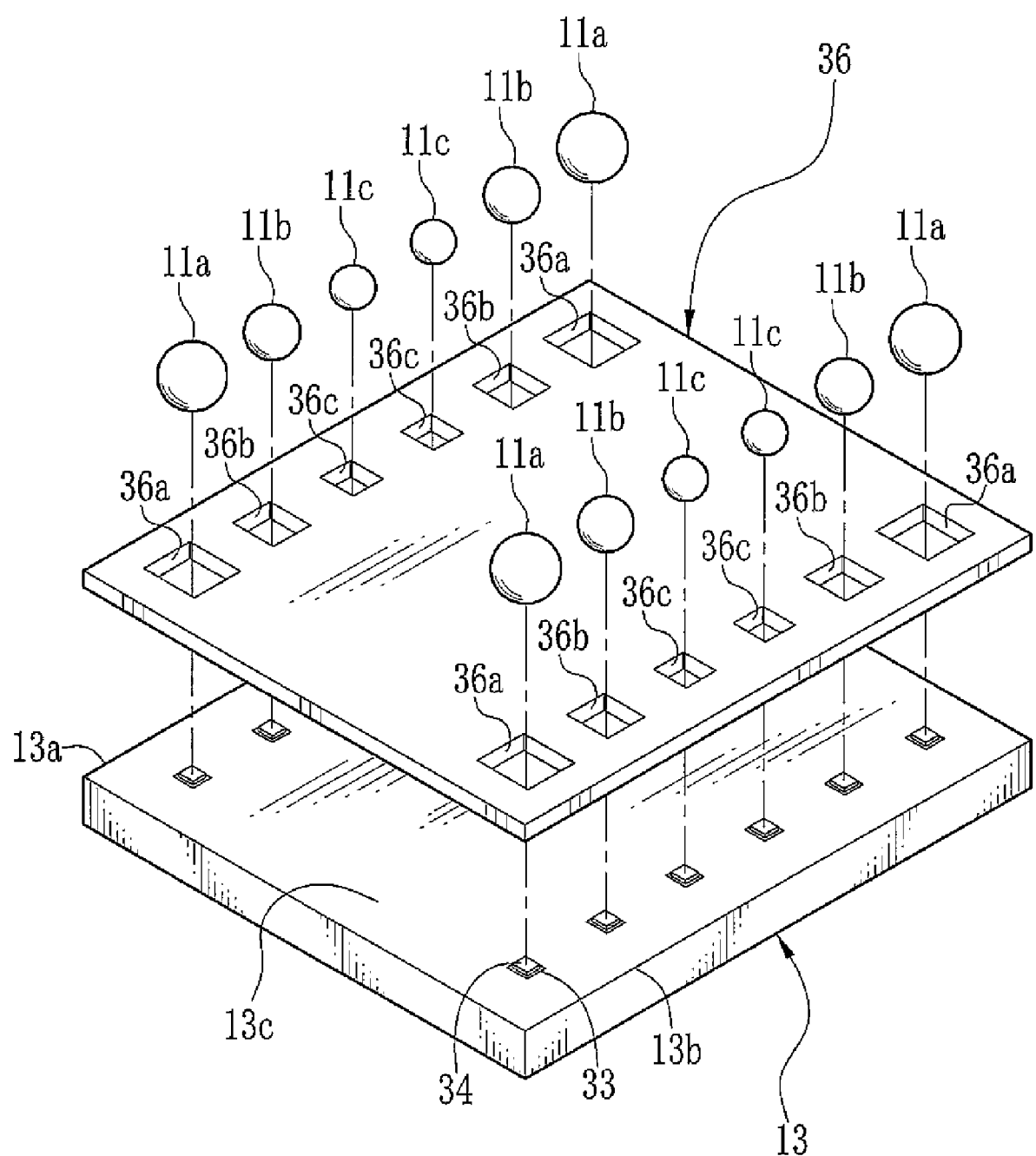
FIG. 5 is an exploded perspective view of the rigid substrate, the mask and the bumps.

By heat-melting the solder paste 34, the bumps 11a-11c are bonded to the electrodes 33. Before this process, a plate-like mask 36, shown in FIG. 5, is placed over the upper surface 13c of the rigid substrate 13. The mask 36 has rectangular openings 36a-36c aligned along a pair of opposing edges. The openings 36a-36c correspond to the diameter of the bumps 11a-11c respectively. The bumps 11a-11c are inserted into the openings 36a-36c, and thereby positioned on the rigid substrate 13. Note that the openings 36a-36c are not limited to a rectangular shape, but may be of circular shape.

Figure 6:
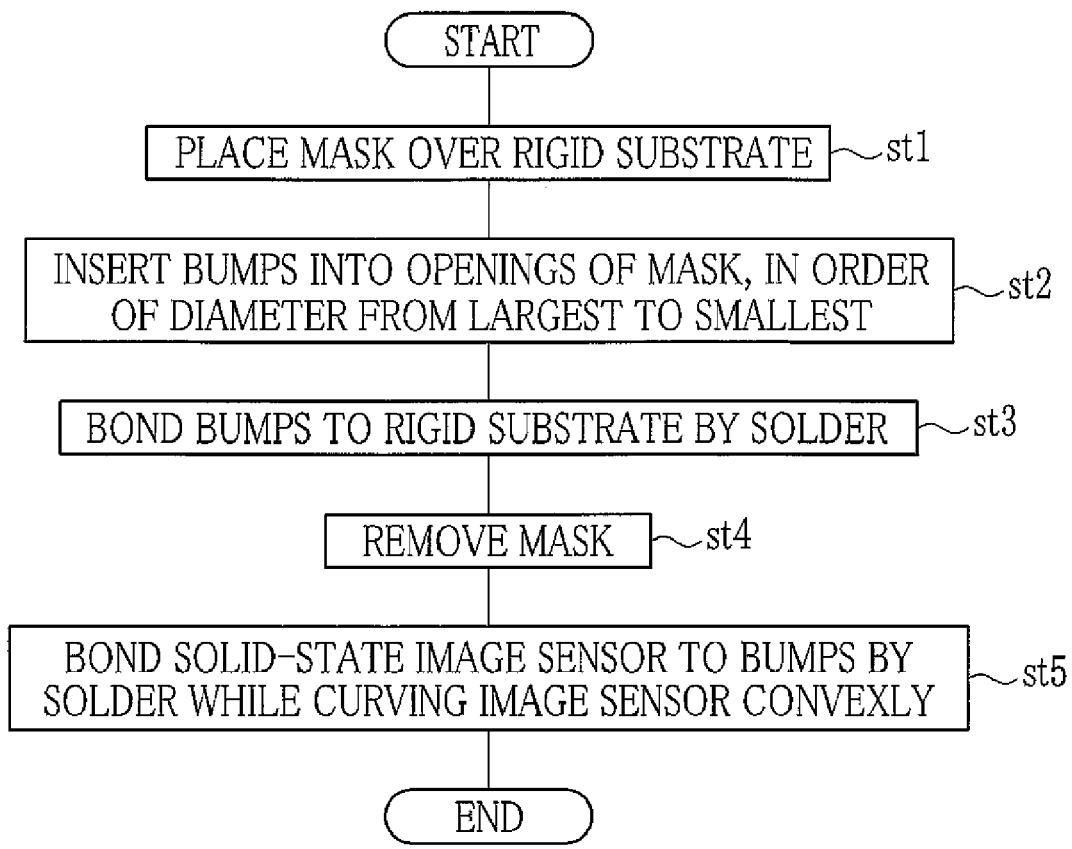
FIG. 6 is a flowchart of a mounting process for the solid-state image sensor.

Next, with referring to FIG. 6, the mounting process for the solid-state image sensor 12 is explained. Firstly, the mask 36 is placed over the upper surface 13c of the rigid substrate 13 (st 1). Then, the largest diameter bumps 11a are inserted into the largest openings 36a. When all the bumps 11a are inserted, the second largest bumps 11b are inserted into the second largest openings 36b. Lastly, the smallest diameter bumps 11c are inserted into the smallest openings 36c (st 2). By inserting the bumps in order of diameters from largest to smallest, in this manner, the small diameter bumps are not mistakenly inserted into the large openings. Accordingly, an appropriate diameter bump is inserted into each opening.

As better shown in FIG. 4, the bumps 11a-11c are positioned on the solder paste 34 by the openings 36a-36c. The rigid substrate 13 in this state is put in a heating furnace, and heated to melt the solder paste 34. The rigid substrate 13 is then taken out from the heating furnace and cooled down for while, and the solder paste 34 solidifies to bond the bumps 11a-11c and the electrodes 33 (st 3). Subsequently, the mask 36 is removed from the rigid substrate 13 (st 4). Thereby, the bumps 11a-11c are aligned along a pair of opposing edges 13a, 13b of the rigid substrate 13.

Figure 7:
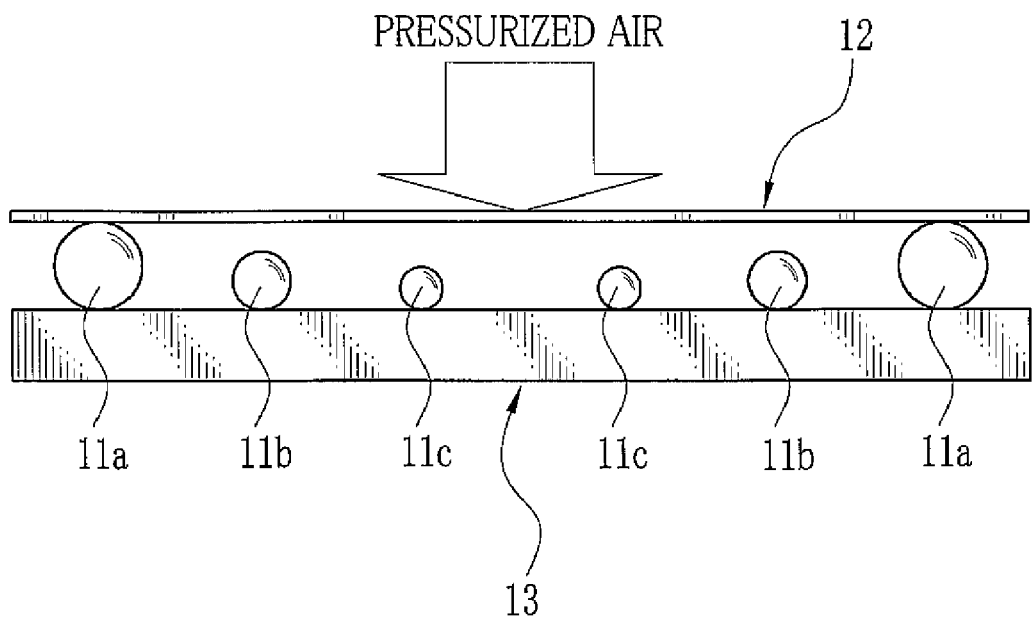
FIG. 7 is a side elevation view of the rigid substrate and the solid-state image sensor before curved.
Figure 8:
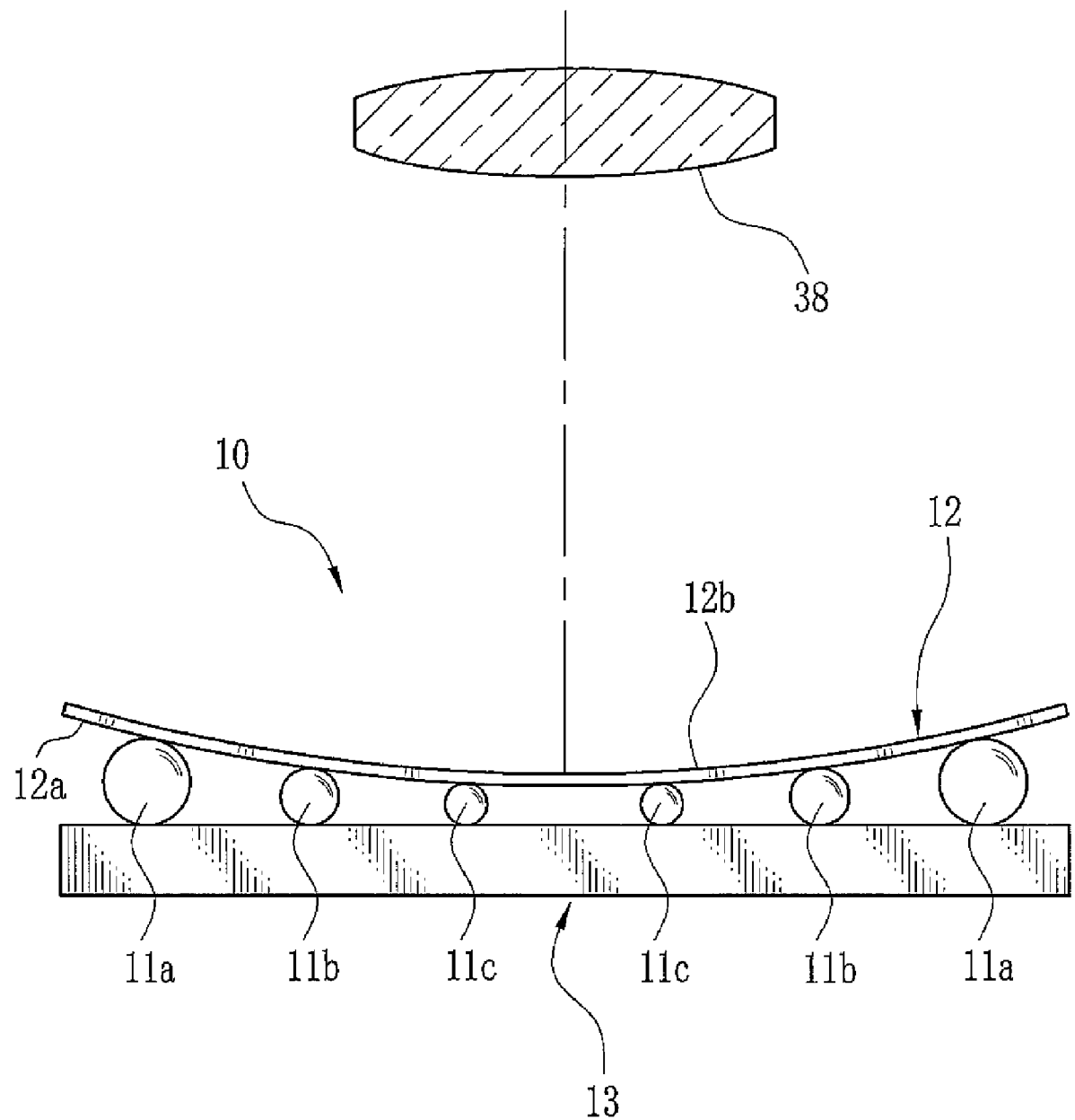
FIG. 8 is a side elevation view of the curved solid-state image sensor.

Next, as shown in FIG. 7, the solid-state image sensor 12 is put on the rigid substrate 13 such that the electrode pads 14 of the solid-state image sensor 12 are positioned to the bumps 11a-11c. The image sensor 12 is supported by the largest diameter bumps 11a at the four corners of the rigid substrate 13. In this state, pressurized air is applied from above to the center of the solid-state image sensor 12. Because of its flexibility, the solid-state image sensor 12 curves convexly to the rigid substrate 13, as shown in FIG. 8, while its edges are pressed down to the bumps 11a-11c. Note that a jig (tool) may be used, instead of the pressurized air, to press the solid-state image sensor 12 to the bumps 11a-11c.

With the solid-state image sensor 12 kept curved, the semiconductor device 10 is put in the heating furnace, and heated to melt the solder paste 23 on the electrode pads 14. Then, the semiconductor device 10 is taken out from the heating furnace and cooled down for while, and the solder paste 23 solidifies to bond the electrode pads 14 and the bumps 11a-11c (st 5). The solid-state image sensor 12 is thereby mounted to the rigid substrate 13 with the back side 12b as the light receiving surface curved to the rigid substrate 13. Note that the solder paste 23 has a lower melting temperature than the solder paste 34. Therefore, the solder paste 34 is not melted to release the bumps 11a-11c from the electrodes 33 of the rigid substrate 13 during the melting process of the solder paste 23.

The curvature of the solid-state image sensor 12 is determined according to the curvature of field of a taking lens 38 for a designated lens unit (not shown). The curved light receiving surface of the image sensor 12 corrects the curvature of field of the taking lens 38. Therefore, a good focusing state is achieved throughout the right receiving surface, and the image quality is improved.

Figure 9:
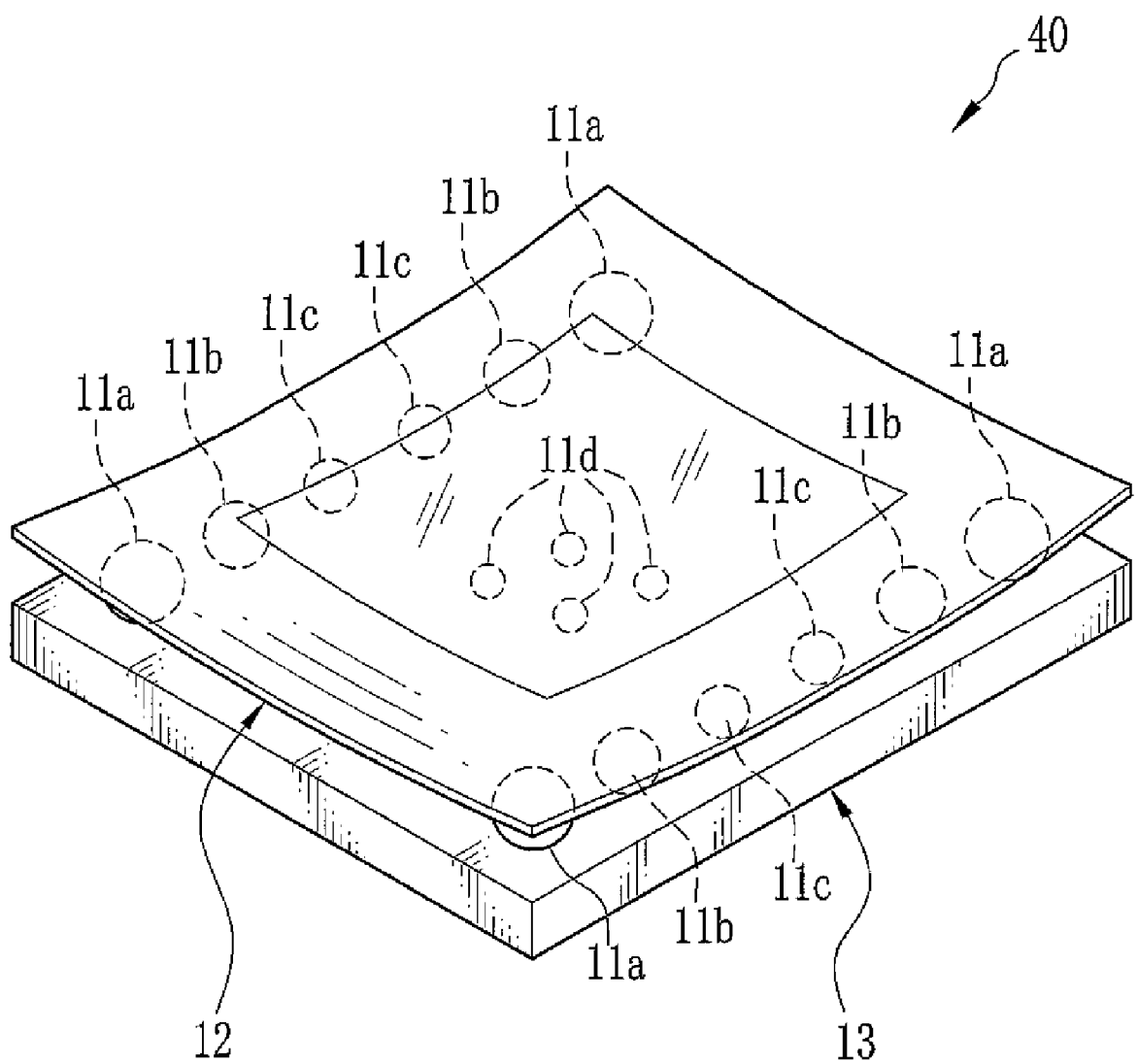
FIG. 9 is a perspective view of a semiconductor device according to a second embodiment of the present invention.

It is possible to increase the number of the bumps. As shown in FIG. 9, a semiconductor device 40 is provided, at the center portion of the rigid substrate 13, with four additional bumps 11d having a smaller diameter than the bumps 11c. Since the center portion of the solid-state image sensor 12 is held by the bumps 11d, the curved shape of the solid-state image sensor 12 is firmly maintained. In this case, extra openings to correspond to the position and the diameter of the bumps 11d are formed on the mask 36 so as to position the bumps 11d on the rigid substrate 13.

Figure 10:
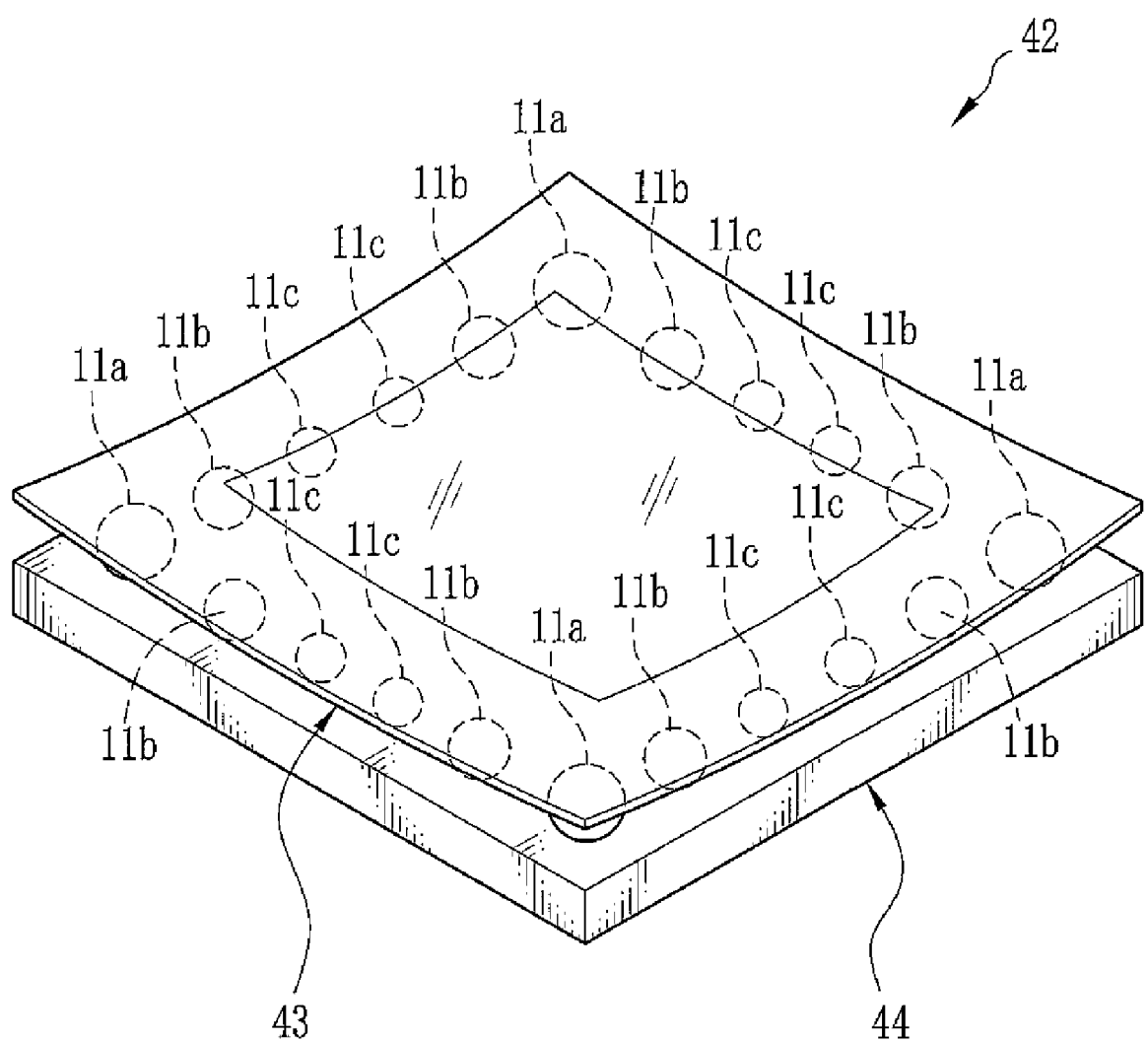
FIG. 10 is a perspective view of a semiconductor device according to a third embodiment of the present invention.

It is also possible to provide the bumps on all sides of the rigid substrate 13. As shown in FIG. 10, a semiconductor device 42 has a substantially square solid-state image sensor 43, which is supported on all four sides by the bumps 11a-11c. The bumps 11a at the four corners have the largest diameter. Similar to the first embodiment, the bumps 11b of the second largest diameter are placed immediately inside the bumps 11a, and the bumps 11c of the smallest diameter are placed inside the bumps 11b in the center of each side of the image sensor 43. This configuration to provide the bumps on all sides of the rigid substrate 13 can firmly maintain the curved shape of the solid-state image sensor 12, and is particularly advantageous for the square or large dimension solid-state image sensors.

When the solid-state image sensor is square, it is preferred to use a square rigid substrate 44 of substantially the same size as the image sensor. To bond by solder the bumps 11a-11c and the rigid substrate 44, in this case, a square mask corresponding to the shape of the rigid substrate 44 is prepared, and openings to correspond to the bumps 11a-11c are formed on all sides of the mask.

Figure 11:
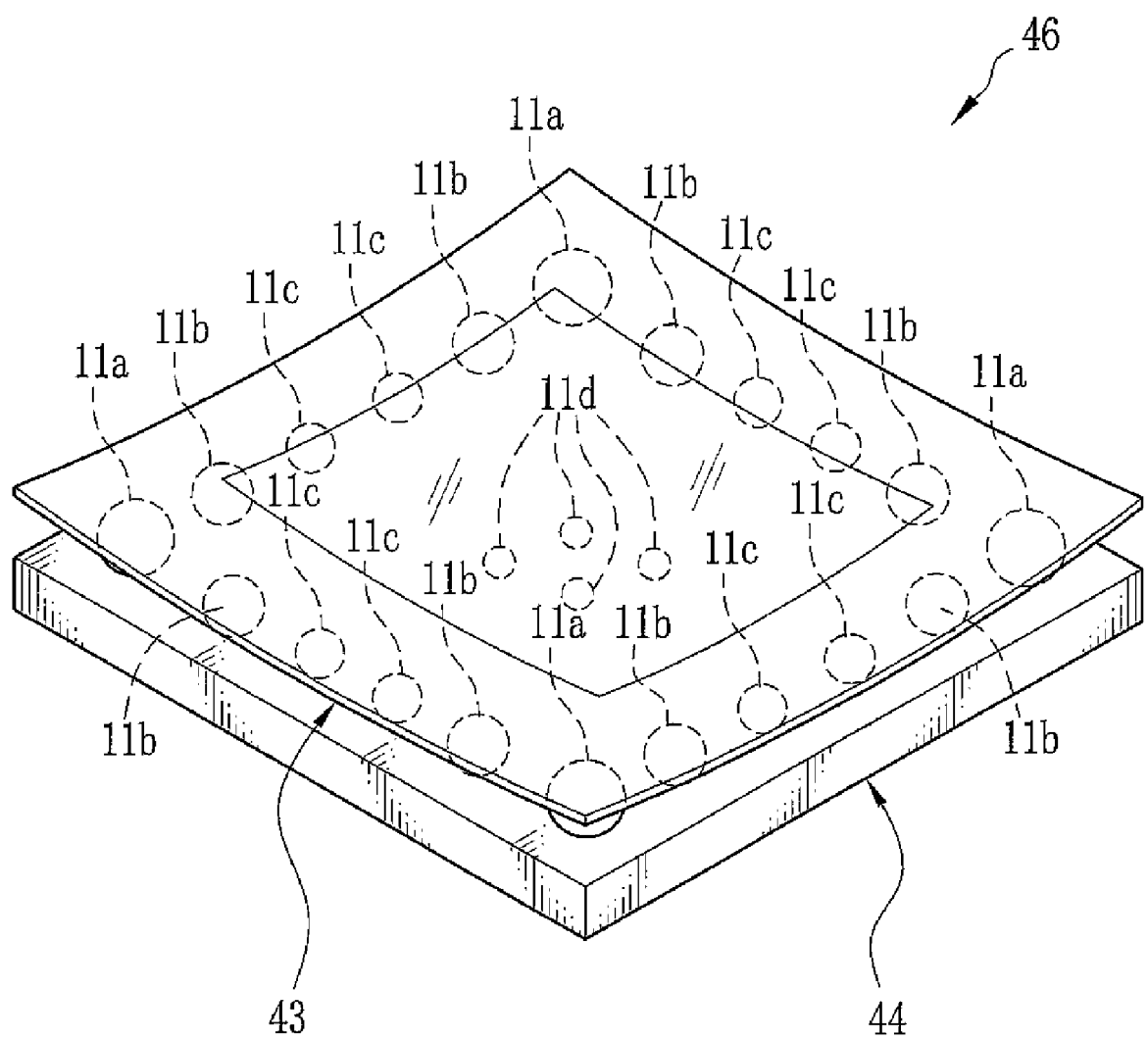
FIG. 11 is a perspective view of a semiconductor device according to a fourth embodiment of the present invention.

Furthermore, it is possible to combine the second embodiment and the third embodiment. As shown in FIG. 11, a semiconductor device 46 is the combination of the solid-state image sensor 43 of the third embodiment and the bumps 11d of the second embodiment. This configuration enables maintaining the curved shape of the solid-state image sensor 43 still more firmly. In this case, to bond by solder the bumps 11d and the rigid substrate 44, extra openings to correspond to the position and the diameter of the bumps 11d are formed on the mask of the third embodiment.

The above embodiments use a single mask with different size openings that correspond to the diameter of the bumps, and all the bumps are positioned and bonded by solder at one time. It is, however, possible to prepare plural masks for each diameter of the bumps, and change the masks for positioning and soldering the different diameter bumps.

While the number of the bumps is twelve in the first embodiment, sixteen in the second embodiment and twenty-four in the third embodiment, the number of the bumps may be determined as needed according to the factors such as the dimension of the solid-state image sensor. Additionally, the bumps are made in three or four diameters in the above embodiments, but they may be made in two or five diameters.

In the above embodiment, the bumps are spherical balls and their diameter is changed to obtain the bumps of different thickness. However, the bumps may be columnar posts, for example, and their height may be changed to obtain the bumps of different thickness.

Although the bumps are made of copper in the above embodiments, the bumps may be made of gold or such metallic material, so long as it is conductive, solderable, and able to keep a diameter against the heat of soldering. Instead of the solder, a conductive adhesive may be used. In this case, since there is no need to consider the heat resistance and solderability, the bumps have only to be conductive and can be made of solder or aluminum.

Although in the above embodiments the solid-state image sensor is 50 micro-meters thick or below for back illumination, the thickness of the solid-state image sensor may be determined as needed without losing its flexibility. While the rigid substrate and the solid-state image sensor have the same rectangular plate-like shape in the above embodiments, the size and shape of the rigid substrate is not limited, so long as the solid-state image sensor can be mounted thereto.

While, in the above embodiment, the rigid substrate is a functional device to conduct signal or such processing for the solid-state image sensor, the rigid substrate may be, for example, an intermediate substrate that supports the solid-state image sensor and transmits the signals between a control circuit and the solid-state image sensor.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A semiconductor device comprising:
   a rigid substrate;
   a plurality of bumps of different thickness, said bumps being aligned and bonded along at least a pair of opposing edges of said rigid substrate, and said bumps at both ends of said edges being thicker than said bumps in the center of said edges; and
   a plate-like flexible semiconductor chip bonded to said bumps and curved convexly to said rigid substrate.

2. The semiconductor device of claim 1, wherein said bumps are aligned along all four edges of said rigid substrate.

3. The semiconductor device of claim 1, wherein said bumps are further disposed in the center of said rigid substrate, and said bumps in the center are thinner than said bumps along said edges.

4. The semiconductor device of claim 1, wherein said semiconductor chip is a back illuminated type solid-state image sensor which has an imaging surface on an opposite side to said rigid substrate.

5. The semiconductor device of claim 4, wherein said rigid substrate is provided with one or both of a drive circuit for driving said solid-state image sensor and a signal processing circuit for processing an image signal from said solid-state image sensor.

* * * * *